(12) United States Patent
Seo et al.

(10) Patent No.: US 11,898,950 B2
(45) Date of Patent: Feb. 13, 2024

(54) DISPLAY DEVICE AND OPERATION METHOD THEREOF

(71) Applicant: Samsung Display Co., Ltd., Yongin-Si (KR)

(72) Inventors: Osung Seo, Hwaseong-si (KR); Myeongil Choi, Hwaseong-si (KR); Sung-Hyun Kim, Anyang-si (KR); Young-Su Kim, Cheonan-si (KR); Kiho Lim, Osan-si (KR); Euiri Cho, Suwon-si (KR); Duk-Woon Choi, Hwaseong-si (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 0 days.

(21) Appl. No.: 18/075,118

(22) Filed: Dec. 5, 2022

(65) Prior Publication Data
US 2023/0213427 A1 Jul. 6, 2023

(30) Foreign Application Priority Data

Jan. 4, 2022 (KR) .......................... 10-2022-0001165

(51) Int. Cl.
| | |
|---|---|
| G09G 3/00 | (2006.01) |
| G09G 3/3241 | (2016.01) |
| G08B 5/36 | (2006.01) |
| H10K 65/00 | (2023.01) |
| G01N 15/06 | (2006.01) |

(52) U.S. Cl.
CPC ............ *G01N 15/06* (2013.01); *G09G 3/035* (2020.08); *G09G 3/3241* (2013.01); *G01N 2015/0693* (2013.01); *G08B 5/36* (2013.01); *G09G 2360/145* (2013.01); *H10K 65/00* (2023.02)

(58) Field of Classification Search
None
See application file for complete search history.

(56) References Cited

U.S. PATENT DOCUMENTS

| | | | |
|---|---|---|---|
| 8,107,059 B2 | 1/2012 | Hwang et al. | |
| 10,788,422 B2 | 9/2020 | Han et al. | |
| 2016/0146715 A1* | 5/2016 | Shim ...................... | G01N 15/06 73/28.01 |
| 2016/0266695 A1* | 9/2016 | Bae ..................... | G06V 40/1318 |
| 2019/0094140 A1* | 3/2019 | Han ........................ | G01N 21/47 |
| 2020/0365677 A1* | 11/2020 | Yun ....................... | G09G 3/3275 |
| 2021/0066442 A1* | 3/2021 | Watanabe ............. | G06F 3/0421 |

FOREIGN PATENT DOCUMENTS

| | | |
|---|---|---|
| KR | 10-1281169 B1 | 7/2013 |
| KR | 10-2019-0034055 A | 4/2019 |
| KR | 10-2020-0140985 A | 12/2020 |

* cited by examiner

*Primary Examiner* — Sardis F Azongha
(74) *Attorney, Agent, or Firm* — Innovation Counsel LLP

(57) ABSTRACT

A display device includes a display panel, a driving controller, and a readout circuit. The display panel includes a first part and a second part. The first part includes a first pixel set. The second part includes a first sensor set. The driving controller controls the first pixel set to emit first light when controlling the first sensor set to receive second light. The first sensor set generates a sensing signal using the second light. The readout circuit is electrically connected to at least one of the driving controller and the first sensor set and receives the sensing signal. The display device calculates a dust concentration using the sensing signal.

20 Claims, 15 Drawing Sheets

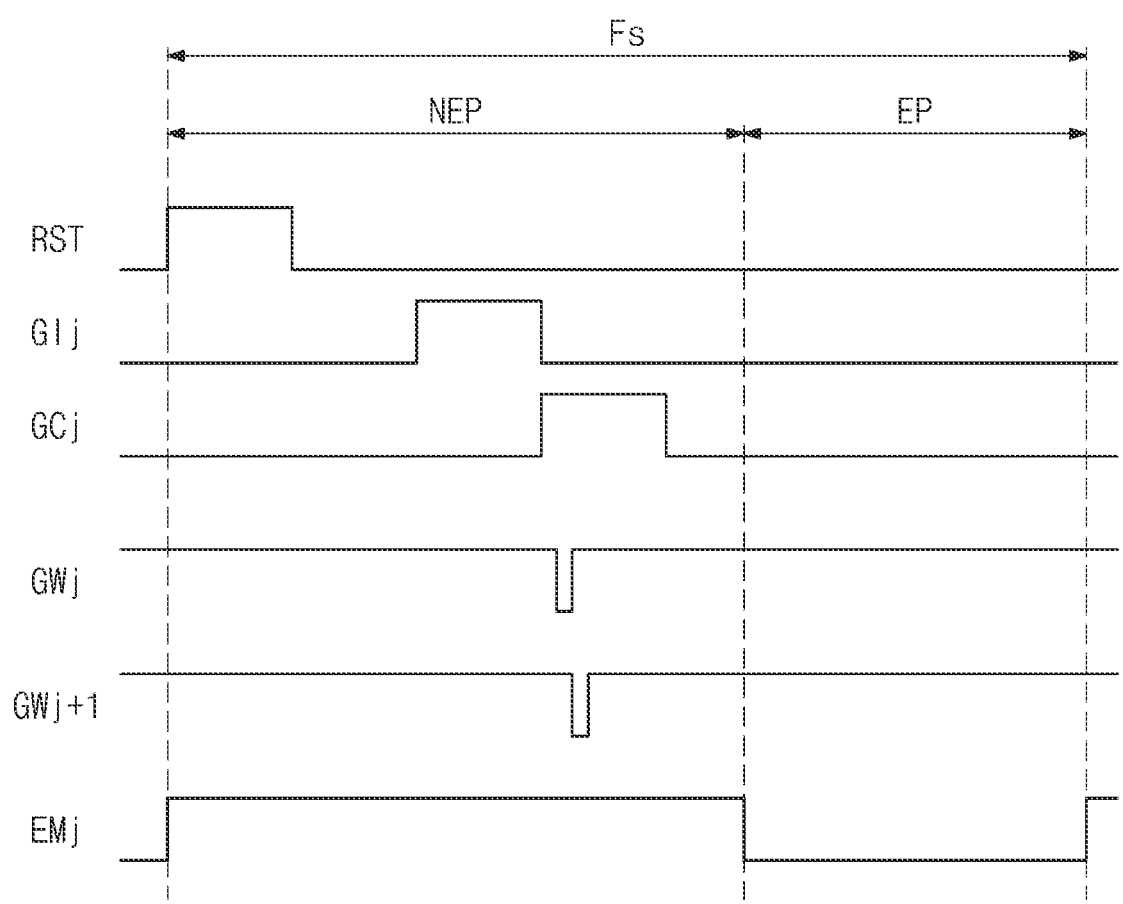

DISPLAY DEVICE AND OPERATION METHOD THEREOF

CROSS-REFERENCE TO RELATED APPLICATION(S)

This application claims priority under 35 U.S.C. § 119 to Korean Patent Application No. 10-2022-0001165 filed on Jan. 4, 2022 in the Korean Intellectual Property Office; the Korean Patent Application is incorporated by reference.

BACKGROUND

The technical field is related to a display device.

A multimedia electronic device (such as a television, a mobile phone, a tablet computer, a navigation system, or a game console) typically includes a display device for displaying images. The display device may be capable of processing a touch-based input, such that a user of the multimedia electronic device may enter information or commands easily and intuitively.

SUMMARY

Embodiments may be related to a display device including a fine dust measuring function. Embodiments may be related to an operation method of the display device.

According to an embodiment, a display device includes a display panel that includes a plurality of pixels and a plurality of sensors, a driving controller that controls the display panel, and a readout circuit that receives a sensing signal from the plurality of sensors. The display panel includes a folding area folded about a folding axis extending in one direction, and a first non-folding area and a second non-folding area which are adjacent to the folding area. During a fine dust sensing mode, the driving controller controls pixels disposed in the first non-folding area from among the plurality of pixels so as to operate in a light emitting mode and controls sensors disposed in the second non-folding area from among the plurality of sensors so as to operate in a light receiving mode. The readout circuit calculates a fine dust concentration based on the sensing signal received from the sensors disposed in the second non-folding area.

Each of the plurality of sensors may include a light sensing element, and a sensor driving circuit that is connected with the light sensing element and outputs the sensing signal corresponding to an external light.

The sensor driving circuit may include a reset transistor that includes a first electrode receiving a reset voltage, a second electrode connected with a first sensing node, and a gate electrode receiving a reset signal, an amplification transistor that includes a first electrode receiving a driving voltage, a second electrode connected with a second sensing node, and a gate electrode connected with the first sensing node, and an output transistor that includes a first electrode connected with the second sensing node, a second electrode connected with a readout line, and a gate electrode receiving a scan signal.

The readout circuit may be connected with the readout line and may receive the sensing signal from the readout line.

The reset transistor may be an N-type transistor, and the amplification transistor and the output transistor may be P-type transistors.

Each of the plurality of pixels may include a light emitting element, and a pixel driving circuit that drives the light emitting element in response to at least one scan line.

The pixel driving circuit may include a first transistor that includes a first electrode electrically connected with a first driving voltage line receiving a first driving voltage, a second electrode electrically connected with the light emitting element, and a gate electrode, a second transistor that is connected between a data line and the first electrode of the first transistor and includes a gate electrode receiving a first scan signal, and a third transistor that is connected between the second electrode of the first transistor and the gate electrode of the first transistor and includes a gate electrode receiving a second scan signal.

The first transistor and the second transistor may be P-type transistors, and the third transistor may be an N-type transistor.

The scan signal provided to the gate electrode of the output transistor in the sensor driving circuit may be identical to the first scan signal provided to the gate electrode of the second transistor in the pixel driving circuit.

The light emitting element may be an organic light emitting diode, and the light sensing element may be an organic photodiode.

The display panel may include a display surface on which an image is displayed. When the display panel is innerfolded about the folding axis, the first non-folding area and the second non-folding area belonging to the display surface may face each other.

When an angle between the first non-folding area and the second non-folding area belonging to the display surface is within a reference range, the driving controller may operate in the fine dust sensing mode.

According to an embodiment, a display device may include a display panel that includes a first area and a second area, each of which includes a plurality of pixels and a plurality of sensors, a driving controller that controls the display panel, and a readout circuit that receives a sensing signal from the plurality of sensors. Each of the plurality of pixels includes a light emitting element and a pixel driving circuit connected with the light emitting element and which drive the light emitting element. Each of the plurality of sensors may include a light sensing element and a sensor driving circuit connected with the light sensing element and which output a sensing signal corresponding to external light. During a fine dust sensing mode, the driving controller may control the plurality of pixels disposed in the first area so as to operate in a light emitting mode and may control the plurality of sensors disposed in the second area so as to operate in a light receiving mode. The readout circuit may calculate a fine dust concentration based on the sensing signal received from the plurality of sensors disposed in the second area.

The sensor driving circuit may include a reset transistor that includes a first electrode receiving a reset voltage, a second electrode connected with a first sensing node, and a gate electrode receiving a reset signal, an amplification transistor that includes a first electrode receiving a driving voltage, a second electrode connected with a second sensing node, and a gate electrode connected with the first sensing node, and an output transistor that includes a first electrode connected with the second sensing node, a second electrode connected with a readout line, and a gate electrode receiving a scan signal.

The pixel driving circuit may include a first transistor that includes a first electrode electrically connected with a first driving voltage line receiving a first driving voltage, a second electrode electrically connected with the light emitting element, and a gate electrode, a second transistor that is connected between a data line and the first electrode of the first transistor and includes a gate electrode receiving a first scan signal, and a third transistor that is connected between the second electrode of the first transistor and the gate electrode of the first transistor and includes a gate electrode receiving a second scan signal.

The light emitting element may be an organic light emitting diode, and the light sensing element may be an organic photodiode.

The display panel may include a folding area folded about a folding axis extending in one direction, and a first non-folding area and a second non-folding area which are adjacent to the folding area.

According to an embodiment, an operation method of a display device may include emitting a light at pixels disposed in a first area of a display panel, receiving a light at sensors disposed in a second area of the display panel, calculating a fine dust concentration based on a sensing signal received from the sensors, and displaying the fine dust concentration in the display panel.

The display panel may include a folding area folded about a folding axis extending in one direction, and a first non-folding area and a second non-folding area which are adjacent to the folding area.

Each of the sensors may include a light sensing element, and a sensor driving circuit that is connected with the light sensing element, and outputs the sensing signal corresponding to an external light.

An embodiment may be related to a display device. The display device may include a display panel, a driving controller, and a readout circuit. The display panel may include a first part and a second part. The first part may include a first pixel set. The second part may include a first sensor set. The driving controller may control the first pixel set to emit first light when controlling the first sensor set to receive second light. The first sensor set may generate a sensing signal using the second light. The readout circuit may be electrically connected to at least one of the driving controller and the first sensor set and may receive the sensing signal. The display device may calculate a dust concentration using the sensing signal.

The first sensor set may include a first sensor. The first sensor may include the following elements: a light sensing element configured to receive the second light; and a sensor driving circuit electrically connected to the light sensing element and configured to output the sensing signal.

The display device may include a readout line configured to transmit the sensing signal. The sensor driving circuit may include the following elements: a first sensing node; a second sensing node; a reset transistor that includes a first electrode for receiving a reset voltage, a second electrode electrically connected to the first sensing node, and a gate electrode for receiving a reset signal; an amplification transistor that includes a first electrode for receiving a driving voltage, a second electrode electrically connected to a second sensing node, and a gate electrode electrically connected to the first sensing node; and an output transistor that includes a first electrode electrically connected to the second sensing node, a second electrode electrically connected to the readout line, and a gate electrode for receiving a scan signal.

The readout circuit may be electrically connected to the readout line for receiving the sensing signal from the readout line.

The reset transistor may be an N-type transistor. The amplification transistor and the output transistor may be P-type transistors.

The first pixel set may include a first pixel. The first pixel may include the following elements: a light emitting element; and a pixel driving circuit configured to drive the light emitting element in response to at least one scan signal.

The pixel driving circuit may include the following elements: a first transistor that includes a first electrode electrically connected to a first driving voltage line for receiving a first driving voltage, a second electrode electrically connected to the light emitting element, and a gate electrode; a second transistor that is electrically connected between a data line and the first electrode of the first transistor and includes a gate electrode for receiving a first scan signal; and a third transistor that is electrically connected between the second electrode of the first transistor and the gate electrode of the first transistor and includes a gate electrode for receiving a second scan signal.

The first transistor and the second transistor may be P-type transistors. The third transistor may be an N-type transistor.

The scan signal provided to the gate electrode of the output transistor in the sensor driving circuit may be identical to the first scan signal provided to the gate electrode of the second transistor in the pixel driving circuit.

The light emitting element may be an organic light emitting diode. The light sensing element may be an organic photodiode.

The first part may include a first image display surface. The second part may include a second image display surface. The driving controller may control the first pixel set to emit the first light and the first sensor set to receive the second light when the first image display surface and the second image display surface face each other.

The driving controller may start controlling the first pixel set to emit the first light and the first sensor set to receive the second light when an angle between the first part and the second part is within a predetermined range.

The display panel may include a third part. The third part may be more flexible than each of the first part and the second part. The first part may be (mechanically) connected through the third part to the second part. The driving controller may start controlling the first pixel set to emit first light and the first sensor set to receive second light when the third part is bent to a degree that is within a predetermined range.

The first part may include a second sensor set. The second part may include a second pixel set. The driving controller may control the second pixel set to emit third light when controlling the second sensor set to receive fourth light.

At least one of the readout circuit and the driving controller may calculate the dust concentration.

The driving controller may control at least one of the first part and the second part to display an image that includes information related to the dust concentration.

The driving controller may control at least the first pixel set to display an image that includes information related to the dust concentration.

An embodiment may be related to a method of operating a display device. The display device may include a display panel. The method may include the following steps: emitting first light using a first pixel set disposed in a first part of the display panel; receiving second light using a first sensor set disposed in a second area of the display panel when the first pixel set emits the first light; generating a sensing signal using the first sensor set and the second light; calculating a dust concentration using at least one of a processor, a driving controller, and a readout circuit of the display device and using the sensing signal; and displaying an image that includes information related to the dust concentration on the display panel.

The emitting and the receiving may be started when an angle between the first part and the second part is within a predetermined range.

The image may be displayed on at least one of the first part of the display panel, the second part of the display panel, and a third part of the display panel. The third part of the display panel may be more flexible than each of the first part of the display panel and the second part of the display panel. The first part of the display panel may be connected through the third part of the display panel to the second part of the display panel.

BRIEF DESCRIPTION OF THE FIGURES

FIG. 7 is a timing diagram for describing operations of the pixel and the sensor illustrated in FIG. 6 according to an embodiment.

DETAILED DESCRIPTION

Figure 1A:
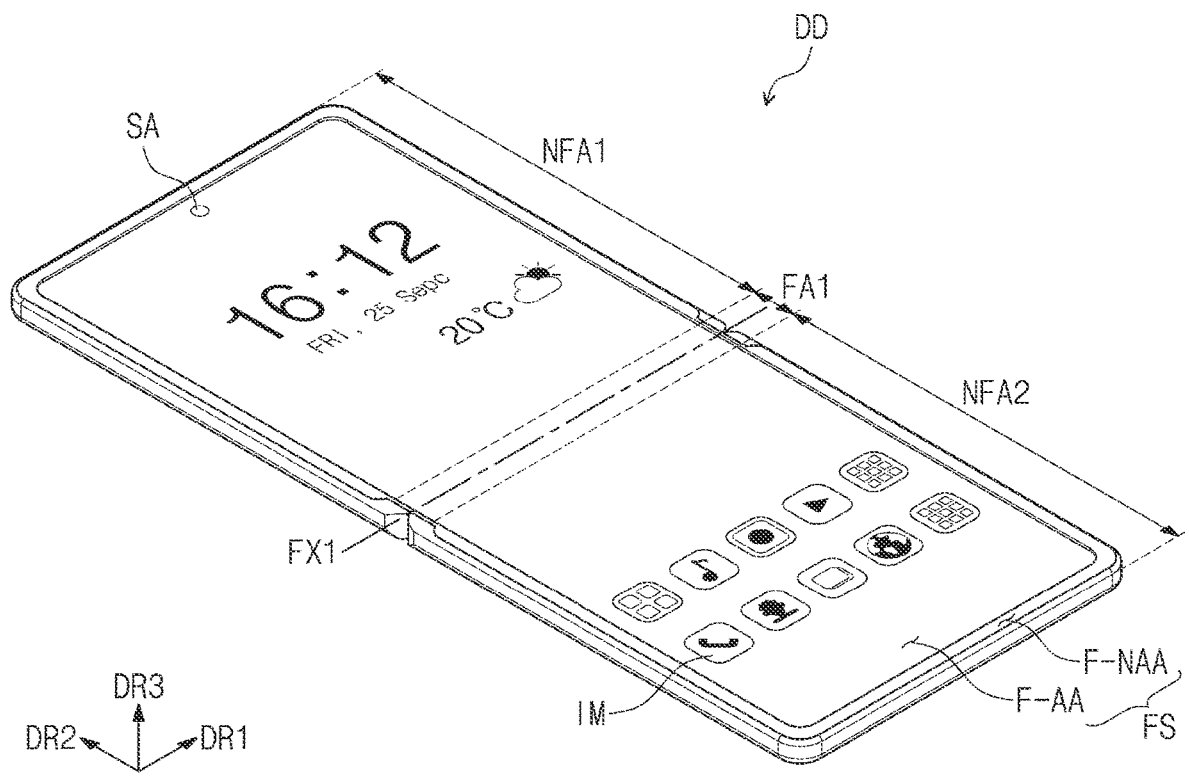
FIG. 1A is a perspective view illustrating an unfolded state of a display device according to an embodiment.

Examples of embodiments are described with reference to the accompanying drawings.

The same reference numeral may refer to the same element/feature or an analogous element/feature. In the drawings, dimensions may be exaggerated for clarity.

The terms "first," "second," etc. are used to describe various elements/features, but the elements/features should not be limited by the terms. The terms are used to distinguish one element/feature from another element/feature. For example, without departing from the scope of practical embodiments, a first component may be referred to as a second component. The description of an element as a "first" element may not require or imply the presence of a second element or other elements. The terms "first," "second," etc. may be used to differentiate different categories or sets of elements. For conciseness, the terms "first," "second," etc. may represent "first-category (or first-set)," "second-category (or second-set)," etc., respectively.

The singular forms may indicate the plural forms unless the context clearly indicates otherwise.

The terms "under", "beneath," "on," "above," etc. may be used to describe a spatial relation between elements of a device illustrated in a drawing. The spatial relation may change according to an orientation of the device.

The terms "include," "comprise," "have," etc. specify the presence of elements/features, but may not preclude the presence of one or more other elements/features.

The term "on" may mean "directly on" or "indirectly on." The term "connect" may mean "directly connect" or "indirectly connect." The term "connect" may mean "mechanically connect" and/or "electrically connect." The term "connected" may mean "electrically connected" or "electrically connected through no intervening transistor." The term "insulate" may mean "electrically insulate" or "electrically isolate." The term "conductive" may mean "electrically conductive." The term "drive" may mean "operate" or "control." The term "include" may mean "be made of." The term "adjacent" may mean "immediately adjacent." The expression that an element extends in a particular direction may mean that the element extends lengthwise in the particular direction and/or that the lengthwise direction of the element is in the particular direction. The term "area" may mean "part," "member," or "panel." The term "defined" may mean "formed" or "provided." The expression that a space or opening overlaps an object may mean that (the position of) the space or opening overlaps with (the position of) the object. The term "overlap" may be equivalent to "be overlapped by." The expression that a first element overlaps with a second element in a plan view may mean that the first element overlaps the second element in direction perpendicular to a substrate.

Figure 1B:
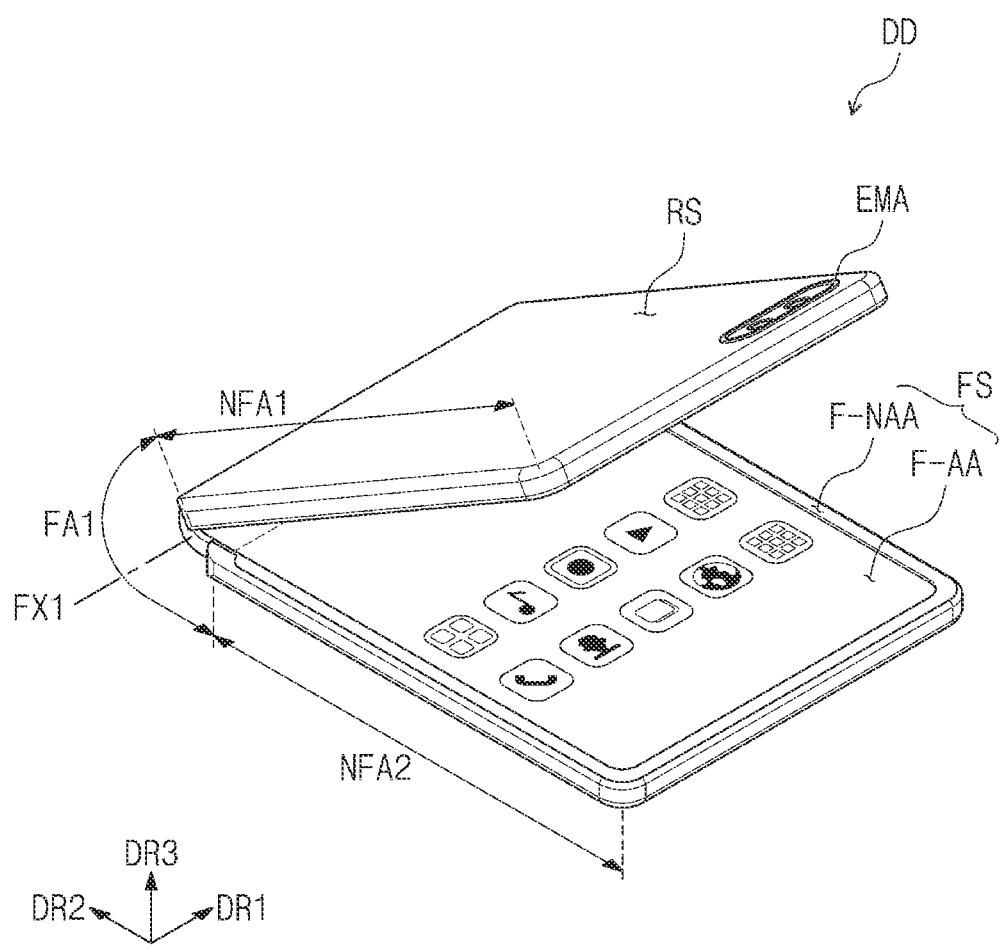
FIG. 1B is a perspective view illustrating that the display device illustrated in FIG. 1A is folded inward according to an embodiment.

FIG. 1A is a perspective view illustrating an unfolded state of a display device DD according to an embodiment. FIG. 1B is a perspective view illustrating that the display device DD illustrated in FIG. 1A is folded inward according to an embodiment.

The display device DD may be an electronic device. For example, the display device DD may be a mobile phone, a tablet, a car navigation system, a game console, and/or a wearable device.

The display device DD may be foldable, flexible, bendable, and/or rollable.

Referring to FIGS. 1A and 1B, the display device DD may include a display surface FS that may extend in a first direction DR1 and a second direction DR2 different from the first direction axis DR1. The display device DD may display an image IM on the display surface FS. The image IM may be displayed in a third direction DR3 different from each of the directions DR1 and DR2. A front surface (or an upper surface) and a rear surface (or a lower surface) of each component are defined according to the third direction DR3, in which the image IM is displayed. Although not illustrated in the drawings, the display device DD may display an image on one or more of the rear surfaces, as well as the front surfaces.

The display device DD may sense an external input. For example, the external input may be/include a contact by a body part (such as a hand) of the user, a hovering action when the user's hand comes close to the display device DD within a given distance, a force, a pressure, a temperature, and/or a light.

The display surface FS of the display device DD may include an active area F-AA and a peripheral area (or non-display area) F-NAA. The active area F-AA may be activated according to an electrical signal. The display device DD may display the image IM through/on the active area F-AA. One or more types of external inputs may be sensed in the active area F-AA. The peripheral area F-NAA is adjacent to the active area F-AA. The peripheral area F-NAA may have a given color. The peripheral area F-NAA may surround the active area F-AA. Accordingly, a shape of the active area F-AA may be defined substantially by the peripheral area F-NAA. The peripheral area F-NAA may abut only one side of the active area F-AA or may be optional.

A sensing area SA may be included in and/or surrounded by the active area F-AA. One or more electronic modules may be disposed in the sensing area SA. For example, the sensing area SA may include at least one of a camera module, a speaker, a light detection sensor, and a thermal detection sensor. The sensing area SA may sense an external object through the display surface FS or may provide a sound signal, such as a voice, to the outside through the display surface FS.

The sensing area SA may be surrounded by the active area F-AA and the peripheral area F-NAA. The sensing area SA may be disposed in the active area F-AA. One sensing area SA is illustrated in FIG. 1A as an example. Multiple sensing areas SA may be implemented in the display device DD.

The sensing area SA may be a portion of the active area F-AA. Accordingly, the display device DD may display an image even in the sensing area SA. When the electronic module(s) disposed in the sensing area SA is deactivated, the sensing area SA may form a display surface for displaying an image.

A rear surface RS of the display device DD may opposite the display surface FS. The rear surface RS is an outer surface of the display device DD and may not display an image in response to signals. The rear surface RS may function as or may include a second display surface for displaying images in response to signals. The rear surface RS may include an electronic module area EMA that accommodates one or more electronic modules.

The display device DD may include a folding area FA1 (or part FA1) and non-folding areas NFA1 and NFA2 (or parts NFA1 and NFA2). The first non-folding area NFA1 may be connected to the second non-folding area NFA2 through the folding area FA1.

Referring to FIG. 1B, the display device DD may be folded/bent about a first folding axis FX1. The first folding axis FX1 illustrated in FIG. 1B may be a virtual/geometric axis extending along in the first direction DR1 and may be parallel to a short side of the display device DD.

The first folding axis FX1 may be in the display surface FS or may be in the rear surface RS. Referring to FIG. 1B, when the display device DD is folded/bent inward, the display surface FS portion of the first non-folding area NFA1 (or first part NFA1) and the display surface FS portion of the second non-folding area NFA2 (or second part NFA2) may face each other, such that the display surface FS is not (completely or conspicuously) exposed to the outside.

Figure 2A:
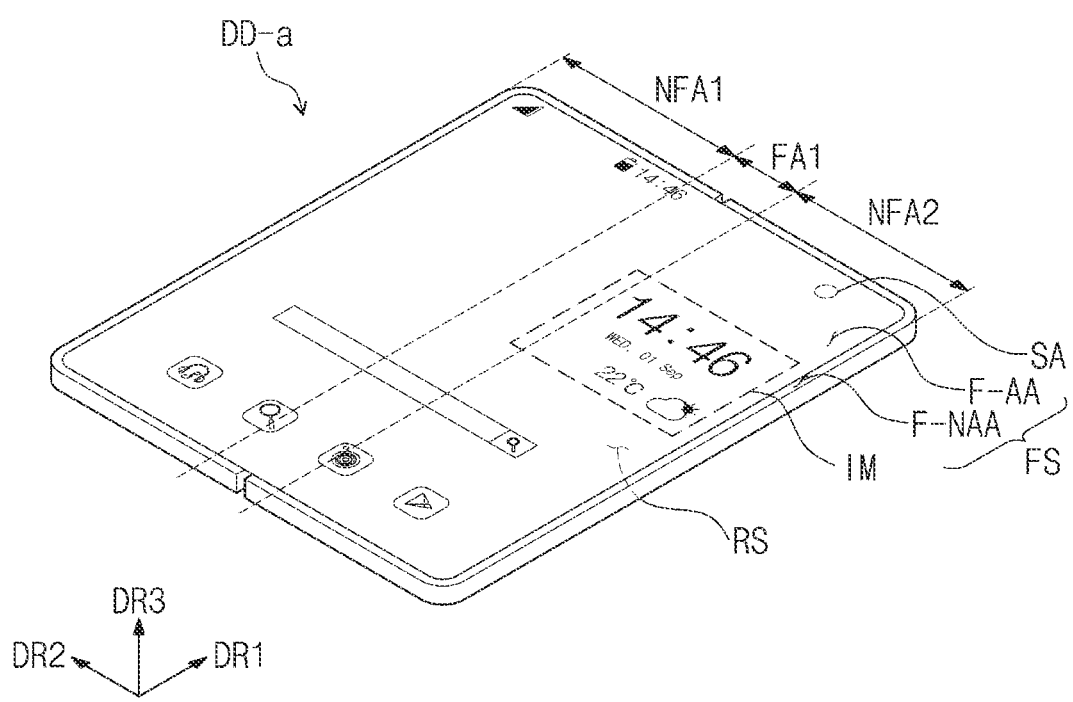
FIG. 2A is a perspective view illustrating an unfolded state of a display device according to an embodiment.
Figure 2B:
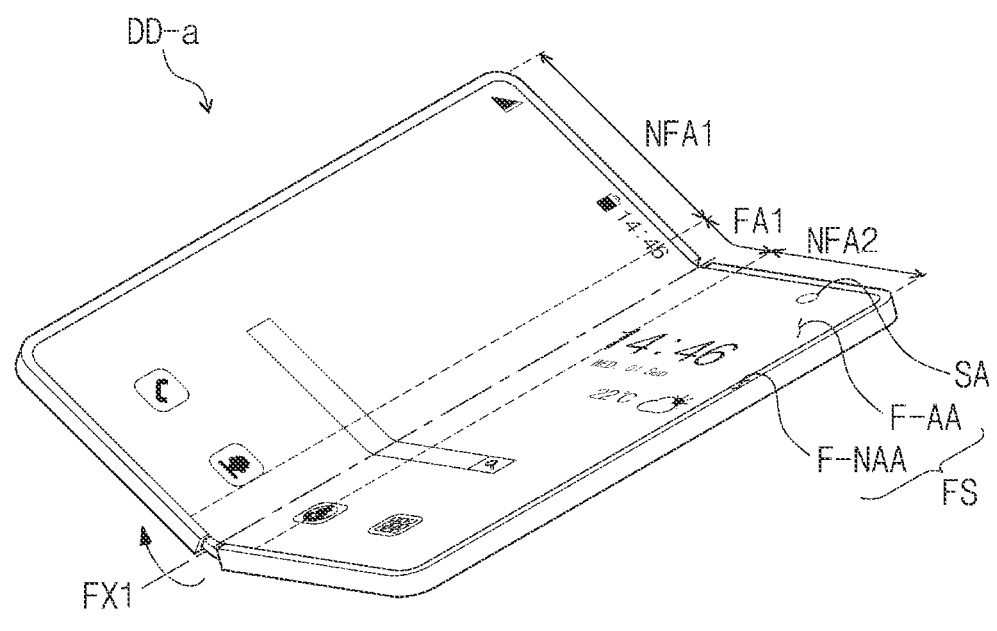
FIG. 2B is a perspective view illustrating that the display device illustrated in FIG. 2A is folded inward according to an embodiment.
Figure 2C:
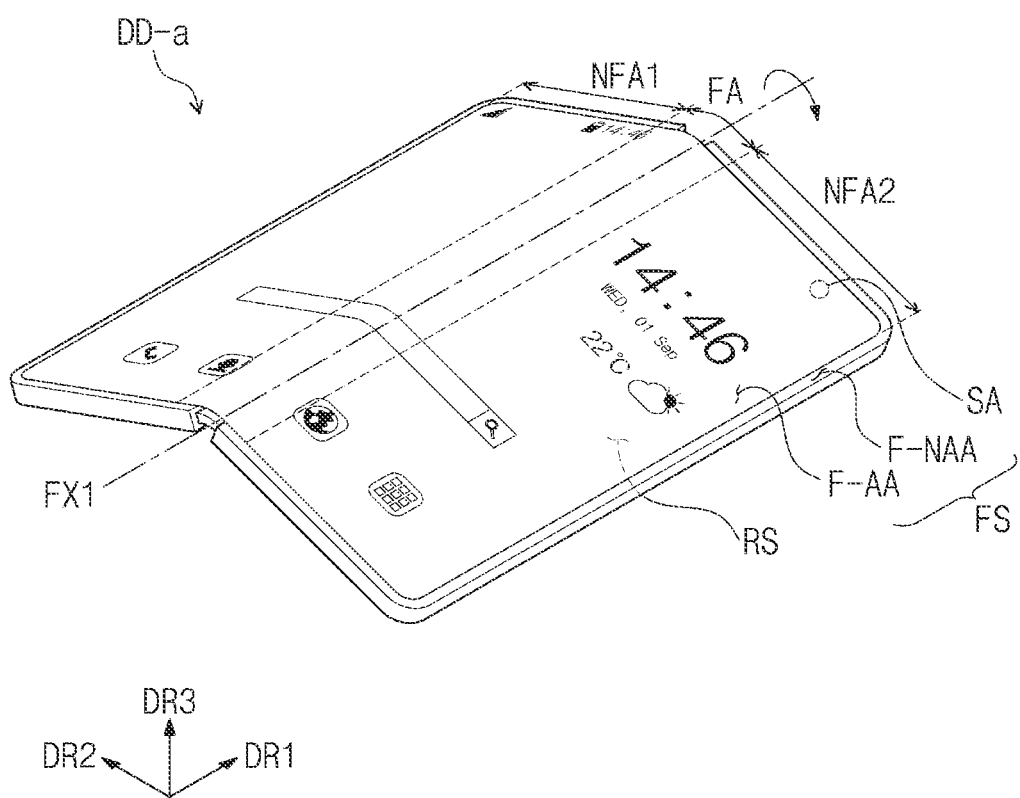
FIG. 2C is a perspective view illustrating that the display device illustrated in FIG. 2A is folded outward according to an embodiment.

FIG. 2A is a perspective view illustrating an unfolded state of a display device DD-a according to an embodiment. FIG. 2B is a perspective view illustrating that the display device DD-a illustrated in FIG. 2A is folded inward according to an embodiment. FIG. 2C is a perspective view illustrating that the display device DD-a illustrated in FIG. 2A is folded outward according to an embodiment.

The display device DD-a may be folded about a first folding axis FX1 that extends in the first direction DR1. The first folding axis FX1 may be parallel a long side of the display device DD-a.

The display device DD-a may include at least one folding area FA1 (or folding part FA1) and non-folding areas NFA1 and NFA2 (or panels NFA1 and NFA2). The non-folding areas NFA1 and NFA2 may be connected to each other through the folding area FA1.

The folding area FA1 may have a curvature with a radius of curvature when the display device DD-a is bent/folded. When the display device DD-a is bent/fold inward, the display surface FS portion of the first non-folding area NFA1 and the display surface FA portion of the second non-folding area NFA2 may face each other, such that the display surface FS is not (completely or conspicuously) exposed to the outside.

Referring to FIG. 2C, the display device DD-a may be folded outward, such that the display surface FS is exposed to the outside in two different directions.

The display device DD-a may include a rear surface RS opposite the display surface FS. The rear surface RS may be exposed when the display device DD-a is unfolded or folded inward, and may be concealed when the display device DD-a is folded outward.

The display surface FS of the display device DD may include an active area F-AA and a peripheral area (or non-display area) F-NAA. A sensing area SA may be included in the active area F-AA. One or more electronic modules may be disposed in the sensing area SA. For example, the sensing area SA may include at least one of a camera module, a speaker, a light detection sensor, and a thermal detection sensor. The sensing area SA may sense an external object through the display surface FS or may provide a sound signal, such as a voice, to the outside through the display surface FS. The electronic module may include a plurality of components.

The display device DD-a may further include a sensing area disposed on the rear surface RS. A camera, a speaker, and/or a light detection sensor may be disposed in the sensing area disposed on the rear surface RS.

Figure 3A:
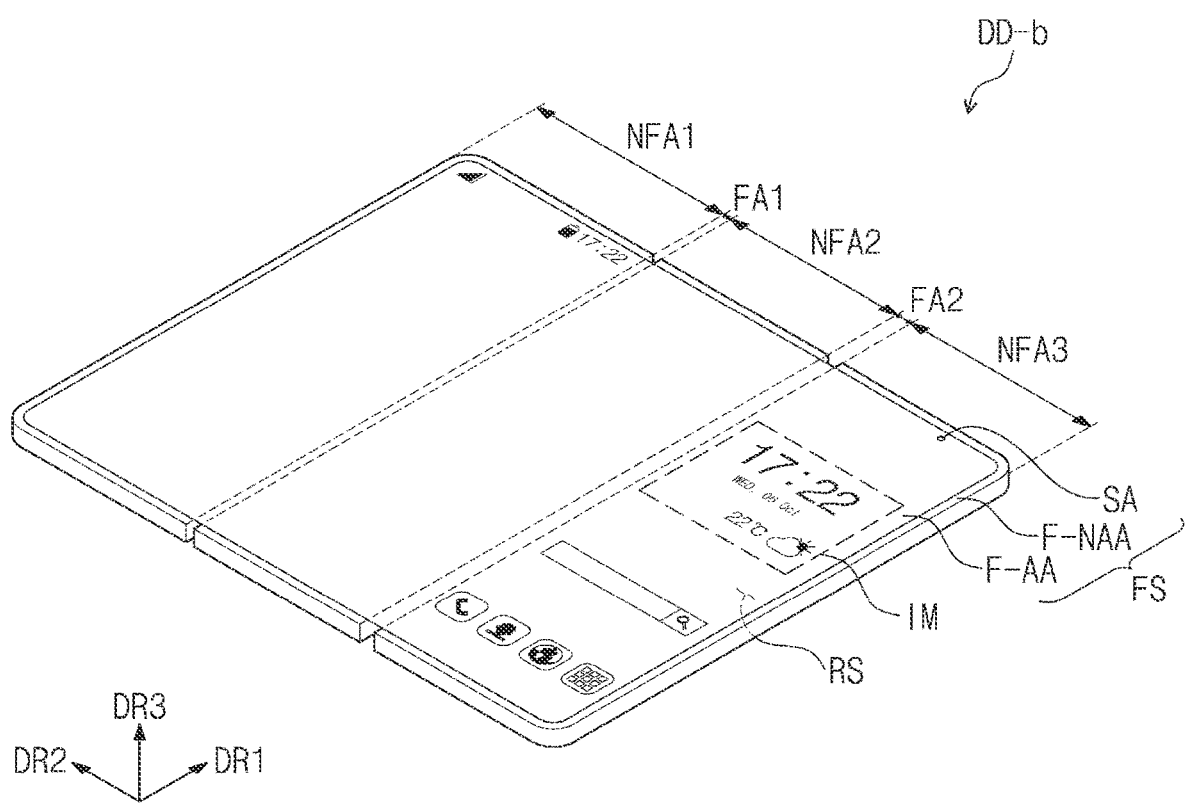
FIG. 3A is a perspective view illustrating an unfolded state of a display device according to an embodiment.
Figure 3B:
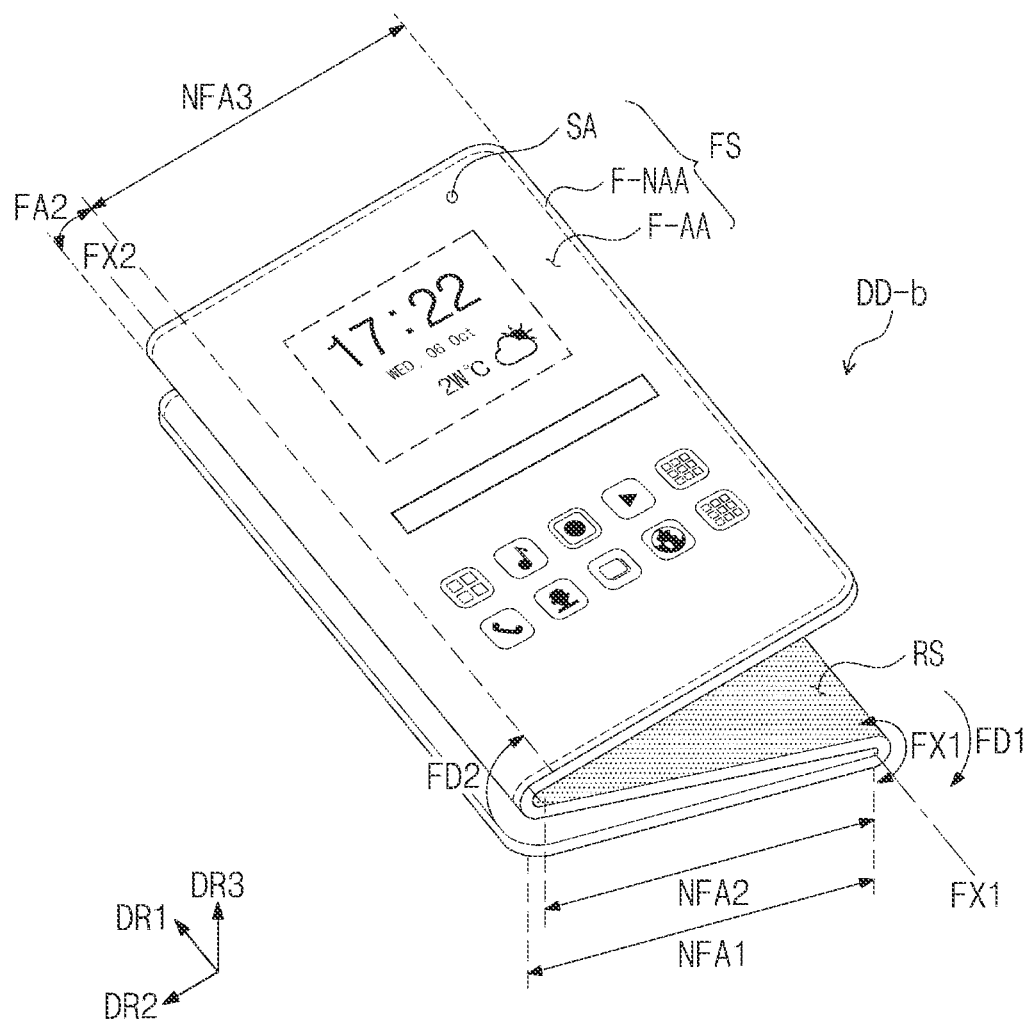
FIG. 3B is a perspective view illustrating that the display device illustrated in FIG. 3A is folded according to an embodiment.

FIG. 3A is a perspective view illustrating an unfolded state of a display device DD-b according to an embodiment. FIG. 3B is a perspective view illustrating that the display device DD-b illustrated in FIG. 3A is folded according to an embodiment.

Referring to FIGS. 3A and 3B, the display device DD-b may include a display surface FS that extends in the first direction DR1 and the second direction DR2. The display device DD-b may display an image IM through/on the display surface FS. The display device DD-b may display the image IM in the third direction DR3.

The display surface FS may include a sensing area SA. The sensing area SA may be a portion of the active area F-AA. Accordingly, the display device DD-b may display an image even in the sensing area SA. When the electronic module(s) disposed in the sensing area SA is deactivated, the sensing area SA may form a display surface for displaying an image. One or more electronic modules may be disposed in the sensing area SA. For example, the sensing area SA may include at least one of a camera module, a speaker, a light detection sensor, and a thermal detection sensor. The sensing area SA may sense an external object through the display surface FS or may provide a sound signal, such as a voice, to the outside through the display surface FS. The electronic module may include a plurality of components.

The display device DD-b may include a first folding area FA1 (or a first folding part FA1), a second folding area FA2 (or second folding part FA2), a first non-folding area NFA1 (or first part NFA1), a second non-folding area NFA2 (or second part NFA2), and a third non-folding area NFA3 (or third part NFA3). The first non-folding area NFA1, the folding area FA1, the second non-folding area NFA2, the second folding area FA2, the third non-folding area NFA3 may be arranged sequentially in a direction opposite to the second direction DR2. The first non-folding area NFA1 and the second non-folding area NFA2 may be connected to each other through the first folding area FA1, and the second non-folding area NFA2 and the third non-folding area NFA3 may be connected to each other through the second folding area FA2.

The number of the folding areas of a display device may be 3 or more, and the number of the non-folding areas of the display device may be 4 or more. The first to third non-folding areas NFA1, NFA2, and NFA3 may have the same area (or size). Two or more of the first to third non-folding areas NFA1, NFA2, and NFA3 may have different areas (or sizes).

The first folding area FA1 may be folded about a first folding axis FX1 extending in the first direction DR1. The second folding area FA2 may be folded about a second folding axis FX2 spaced from the first folding axis FX1 and extending in the first direction DR1. The first folding axis FX1 and the second folding axis FX2 may respectively extend in two different directions.

In the display device DD-b according to an embodiment, the first folding area FA1 may be folded in a first folding direction FD1 (e.g., a clockwise direction), such that the display surface FS portion of the first non-folding area NFA1 and the display surface FS portion of the second non-folding area NFA2 face each other. The second folding area FA2 may be folded in a second folding direction FD2 (e.g., a counterclockwise direction), such that the display surface FS portion of the third non-folding area NFA3 is exposed, and such that the rear surface RS portion of the second non-folding area NFA2 and the rear surface RS portion of the third non-folding area NFA3 face each other.

The first folding axis FX1 may be a virtual/geometric axis in the display surface FS. The second folding axis FX2 may be a virtual/geometric axis in the rear surface RS.

The first non-folding area NFA1 and the second non-folding area NFA2 folded in the first folding direction FD1 may be folded inward. The third non-folding area NFA3 folded in the second folding direction axis FD2 may be folded outward.

Referring to FIGS. 1A to 3B, for the display devices DD, DD-a, and DD-b, switches from an unfolded state to an inward-folded or outward-folded state and switches from the inward-folded or outward folded state to the unfolded state may be performed numerous times.

One or more of the display devices DD, DD-a, and DD-b may be flexible, bendable, and/or rollable.

Figure 4:
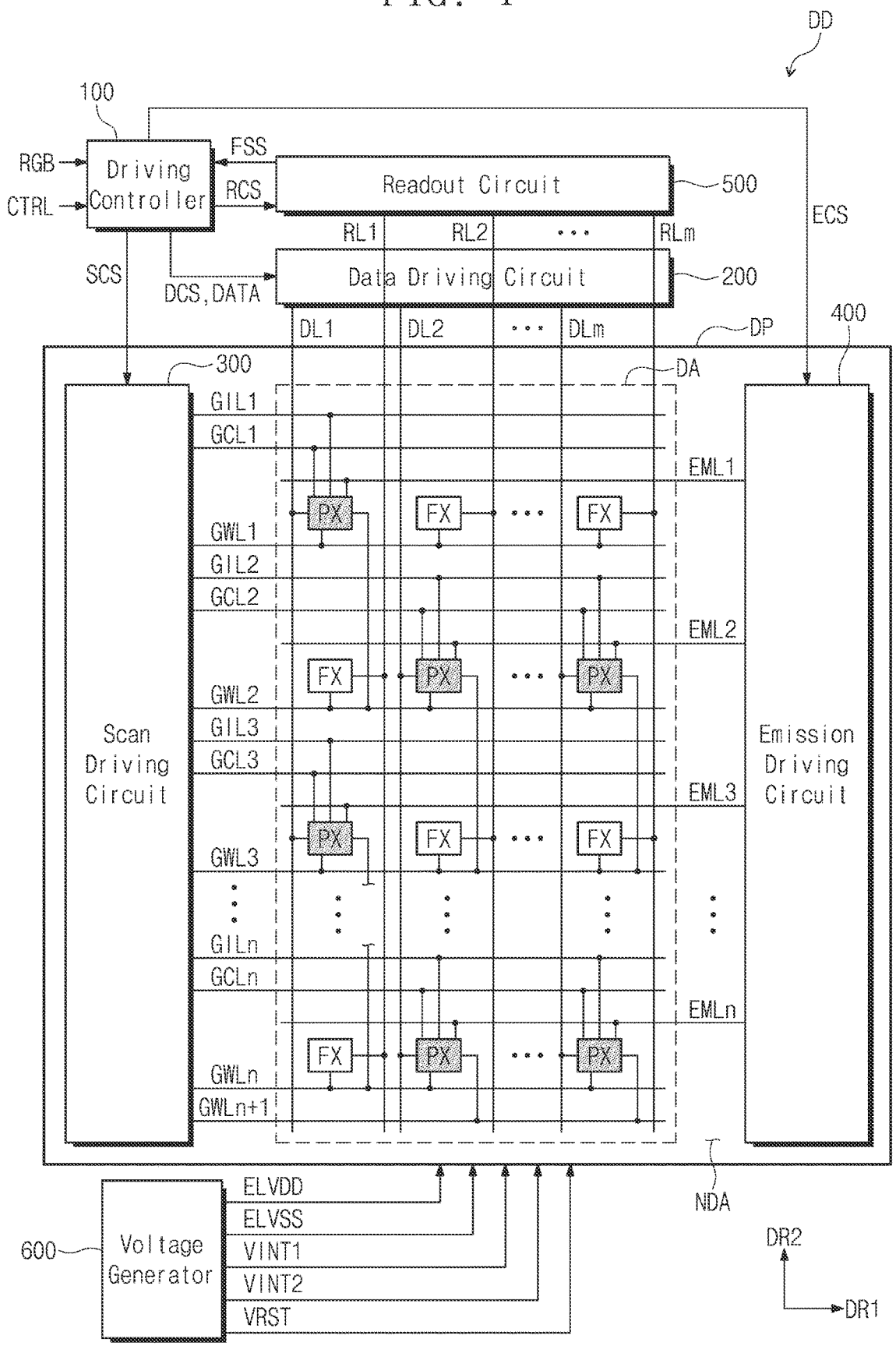
FIG. 4 is a block diagram of a display device according to an embodiment.

FIG. 4 is a block diagram of a display device according to an embodiment.

Referring to FIG. 4, the display device DD includes a display panel DP, a driving controller 100, a data driving circuit 200, a scan driving circuit 300, an emission driving circuit 400, a readout circuit 500, and a voltage generator 600.

The driving controller 100 receives an image signal RGB and a control signal CTRL. The driving controller 100 generates an image data signal DATA by converting a data format of the image signal RGB in compliance with the specification for an interface with the data driving circuit 200. The driving controller 100 outputs a scan control signal SCS, a data control signal DCS, and an emission control signal ECS.

The data driving circuit 200 receives the data control signal DCS and the image data signal DATA from the driving controller 100. The data driving circuit 200 converts the image data signal DATA into data signals and outputs the data signals to a plurality of data lines DL1, DL2 to DLm. The data signals are analog voltages corresponding to gray scale values of the image data signal DATA.

The voltage generator 600 generates voltages necessary for an operation of the display panel DP. The voltage generator 600 generates a first driving voltage ELVDD, a second driving voltage ELVSS, a first initialization voltage VINT1, a second initialization voltage VINT2, and a reset voltage VRST.

The display panel DP includes scan lines GIL1, GIL2, GIL3 to GILn; GCL1, GCL2, GCL3 to GCLn; and GWL1, GWL2, GWL3 to GWLn, GWLn+1; emission control lines EML1, EML2, EML3 to EMLn; the data lines DL1, DL2 to DLm; readout lines RL1, RL2 to RLm, pixels PX, and sensors FX.

The display panel DP may include a display area DA and a non-display area NDA. The pixels PX and the sensors FX may be disposed in the display area DA.

The scan driving circuit 300 and the emission driving circuit 400 may be disposed in the non-display area NDA of the display panel DP. The scan driving circuit 300 is disposed on a first side of the display panel DP. The scan lines GIL1 to GILn, GCL1 to GCLn, and GWL1 to GWLn+1 extend from the scan driving circuit 300 in the first direction DR1.

The scan lines GIL1 to GILn, GCL1 to GCLn, and GWL1 to GWLn+1 and the emission control lines EML1 to EMLn are spaced from each other in the second direction DR2. The data lines DL1 to DLm extend from the data driving circuit 200 in a direction opposite to the second direction DR2 and are spaced from each other in the first direction DR1.

The FIG. 4 illustrates that the scan driving circuit 300 and the emission driving circuit 400 are arranged at opposite sides with respect to the pixels PX. The scan driving circuit 300 and the emission driving circuit 400 may be disposed adjacent to each other on a first side or a second side of the display panel DP. The scan driving circuit 300 and the emission driving circuit 400 may be implemented in one circuit.

The pixels PX are electrically connected to the scan lines GIL1 to GILn, GCL1 to GCLn, and GWL1 to GWLn+1, the emission control lines EML1 to EMLn, and the data lines DL1 to DLm. Each of the pixels PX may be electrically connected to four scan lines and one emission control line. Pixels PX in a first row may be connected to the scan lines GIL1, GCL1, GWL1, and GWL2 and the emission control line EML1. Pixels PX in a j-th row may be connected to the scan lines GILj, GCLj, GWLj, and GWLj+1 and the emission control line EMLj, wherein j is an integer in the range of 1 to n.

Each of the pixels PX includes a light emitting element ED (refer to FIG. 6) and a pixel driving circuit PDC (refer to FIG. 6) for controlling the light emission of the light emitting element ED. The pixel driving circuit PDC may include one or more transistors and one or more capacitors. The scan driving circuit 300 and the emission driving circuit 400 may include transistors that are formed through the same process(es) as the pixel driving circuit PDC.

Each of the pixels PX receives the first driving voltage ELVDD, the second driving voltage ELVSS, the first initialization voltage VINT1, and the second initialization voltage VINT2 from the voltage generator 600.

The scan driving circuit 300 receives the scan control signal SCS from the driving controller 100. The scan driving circuit 300 may output scan signals to the scan lines GIL1, to GILn, GCL1 to GCLn, and GWL1 to GWLn+1 in response to the scan control signal SCS.

The emission driving circuit 400 is disposed on the second side of the display panel DP. The emission control lines EML1 to EMLn extend from the emission driving circuit 400 in a direction opposite to the first direction DR1. The emission driving circuit 400 may output emission control signals to the emission control lines EML1 to EMLn.

Figure 6:
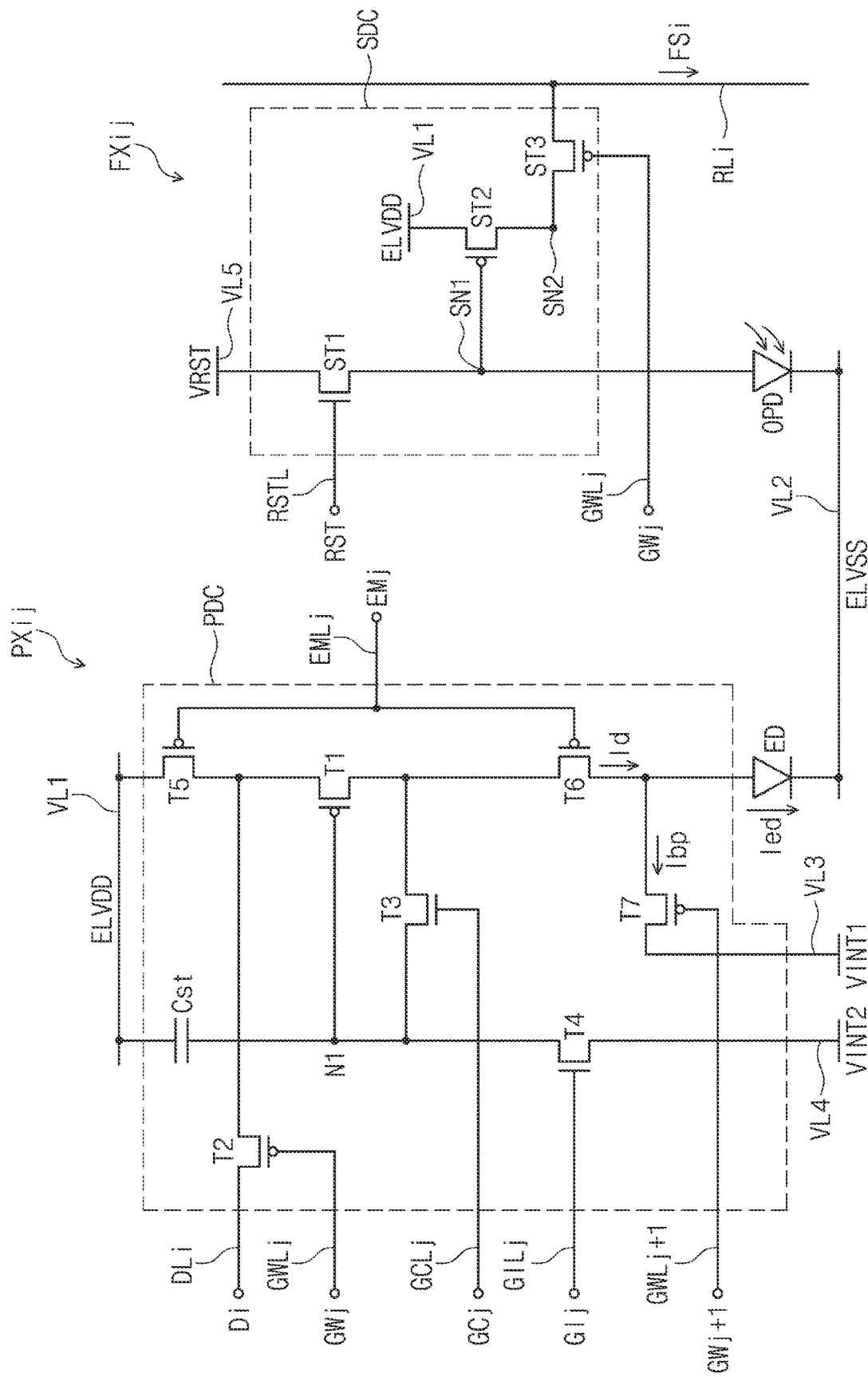
FIG. 6 is a circuit diagram of a pixel and a sensor according to an embodiment.

Each of the sensors FX includes a light sensing element OPD (refer to FIG. 6) and a sensor driving circuit SDC (refer to FIG. 6). The sensor driving circuit SDC may include one or more transistors. The sensor driving circuit SDC may include transistors that are formed through the same process(es) as the pixel driving circuit PDC.

Each of the sensors FX may be connected to one corresponding scan line of the scan lines GWL1 to GWn+1 and one corresponding readout line of the readout lines RL1 to RLm. The number of sensors FX may be equal to the number of pixels PX. The number of sensors FX may be less than the number of pixels PX.

The readout circuit 500 receives a readout control signal RCS from the driving controller 100. The readout circuit 500 may receive sensing signals from the readout lines RL1 to RLm in response to the readout control signal RCS and may provide a readout signal FSS to the driving controller 100. The readout signal FSS may be a fingerprint sensing signal corresponding to a user's fingerprint. The readout signal FSS may be a fine dust signal resulted from measuring fine dust in the air.

The readout circuit 500 may provide a reset signal RST (refer to FIG. 6) to the sensors FX. Instances/copies of the same reset signal RST may be provided to all the sensors FX.

Figure 5:
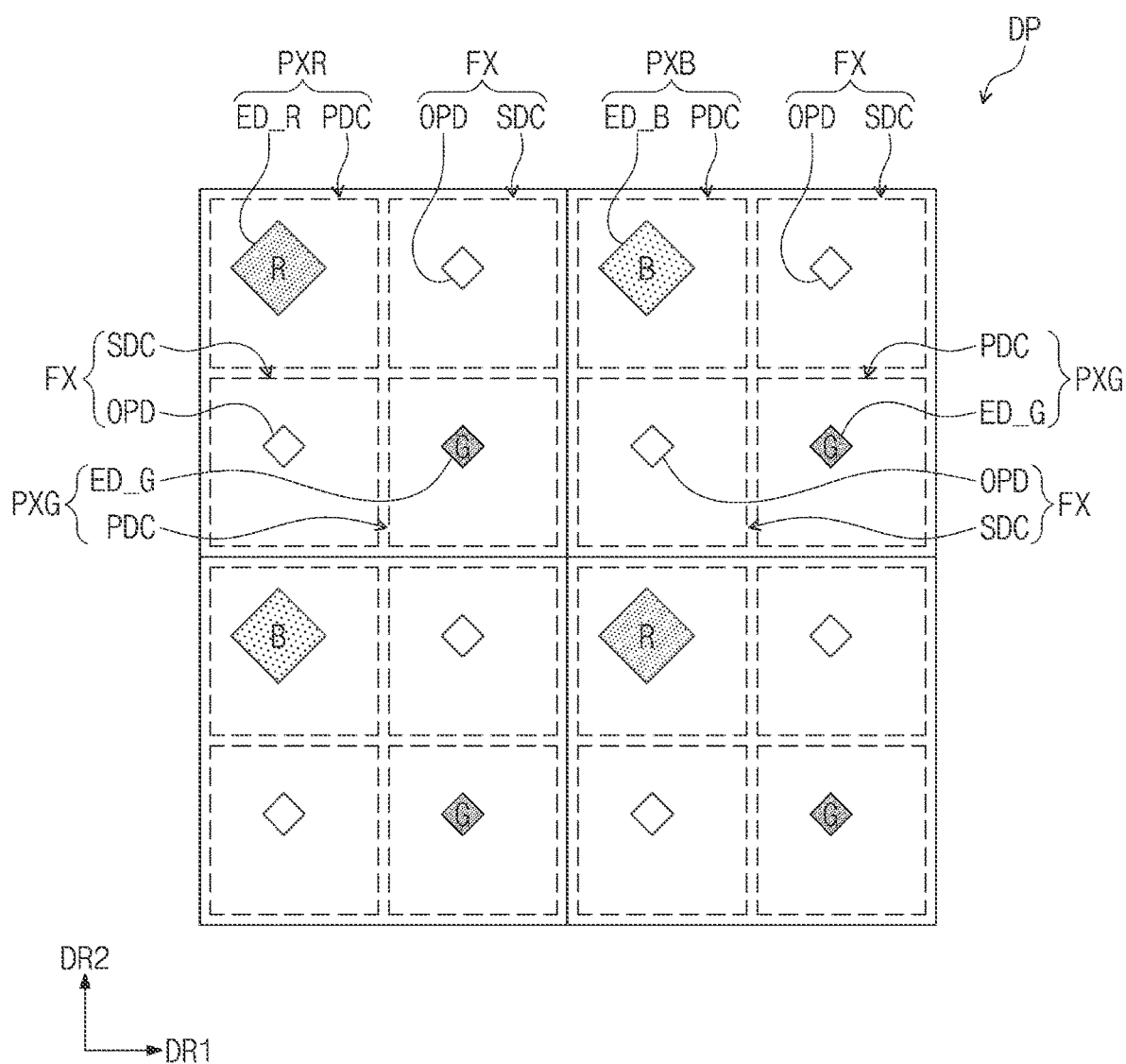
FIG. 5 is a plan view of a partial area of a display panel according to an embodiment.

FIG. 5 is a plan view of a partial area of a display panel according to an embodiment.

Referring to FIG. 5, pixels PXR, PXG, and PXB are arranged in a display area of the display panel DP. Each pixel PXR includes a light emitting element ED_R and a pixel driving circuit PDC; each pixel PXG includes a light emitting element ED_G and a pixel driving circuit PDC; and each pixel PXB includes a light emitting element ED_B and a pixel driving circuit PDC. Each of the sensors FX includes the light sensing element OPD and the sensor driving circuit SDC.

Pixels PXR, PXG, and PXB and sensors FX are alternately disposed in the first direction DR1 and are alternately disposed in the second direction DR2. Each of the first pixels PXR includes a first light emitting element ED_R for outputting a light of a first color (e.g., red (R)). Each of the second pixels PXG includes a second light emitting element ED_G for outputting a light of a second color (e.g., green (G)). Each of the third pixels PXB includes a third light emitting element ED_B for outputting a light of a third color (e.g., blue (B)).

As illustrated in FIG. 5, first pixels PXR and third pixels PXB may be alternately disposed in the second direction DR2 and in the first direction DR1. The second pixels PXG may be arranged in the first and second direction DR1 and DR2.

A sensor FX may be disposed between a first pixel PXR and a third pixel PXB that are adjacent to each other in one of the first and second directions DR1 and DR2. A sensor FX may be disposed between two second pixels PXG that are adjacent to each other in one of the first and second directions.

A first light emitting element ED_R may be larger than a second light emitting element ED_G. A size of a third light emitting element ED_B may be larger than or equal to that of a first light emitting element ED_R. Two or all of a first light emitting element ED_R, a second light emitting element ED_G, and a third light emitting element ED_B may have the same size.

Each of the first to third light emitting elements ED_R, ED_G, and ED_B may have a quadrangle. One or more of the first to third light emitting elements ED_R, ED_G, and ED_B may have one or more shapes, such as one or more of a polygon, a circle, and/or an oval. Two or all of a first light emitting element ED_R, a second light emitting element ED_G, and a third light emitting element ED_B may have different shapes. A second light emitting element ED_G may have a shape of a circle, and each of a first light emitting element ED_R and a third light emitting element ED_B may have a shape of a quadrangle.

The area that a sensor driving circuit SDC occupies may be smaller than the area that a pixel driving circuit PDC occupies.

FIG. 6 is a circuit diagram of a pixel and a sensor according to an embodiment.

FIG. 6 illustrates one pixel PXij of the pixels PX illustrates in FIG. 4 and one sensor FXij of the sensors FX illustrates in FIG. 4. Other pixels PX illustrated in FIG. 4 may have the same circuit configuration as the equivalent circuit diagram of the pixel PXij illustrated in FIG. 6. Other sensors FX illustrated in FIG. 4 may have the same circuit configuration as the equivalent circuit diagram of the sensor FXij illustrated in FIG. 6.

Referring to FIG. 6, the pixel PXij includes the pixel driving circuit PDC and at least one light emitting element ED. The light emitting element ED may be a light emitting diode. The light emitting element ED may be an organic light emitting diode including an organic light emitting layer. The pixel driving circuit PDC includes first to seventh transistors T1, T2, T3, T4, T5, T6, and T7 and one capacitor Cst.

The third and fourth transistors T3 and T4 may be N-type transistors that use an oxide semiconductor as a semiconductor layer. Each of the first, second, fifth, sixth, and seventh transistors T1, T2, T5, T6, and T7 may be P-type transistors that have a low-temperature polycrystalline silicon (LTPS) semiconductor layer. All the first to seventh transistors T1 to T7 may be P-type transistors. All the first to seventh transistors T1 to T7 may be N-type transistors. At least one of the first to seventh transistors T1 to T7 may be an N-type transistor and the others thereof may be P-type transistors. The configuration of the pixel driving circuit PDC may be modified according to particular embodiments.

The scan lines GILj, GCLj, GWLj, and GWLj+1 may transfer scan signals GIj, GCj, GWj, and GWj+1, respectively, and the emission control line EMLj may transfer an emission control signal EMj. A data line DLi transfers a data signal Di. The data signal Di may have a voltage level corresponding to the image signal RGB input to the display device DD (refer to FIG. 4). First to fourth driving voltage lines VL1, VL2, VL3, and VL4 may transfer the first driving voltage ELVDD, the second driving voltage ELVSS, the first initialization voltage VINT1, and the second initialization voltage VINT2, respectively.

The first transistor T1 includes a first electrode connected to the first driving voltage line VL1 through the fifth transistor T5, a second electrode electrically connected to an anode of the light emitting element ED through the sixth transistor T6, and a gate electrode connected to a first end of the capacitor Cst. The first transistor T1 may receive the data signal Di through the data line DLi depending on a switching operation of the second transistor T2 and may supply a driving current Id to the light emitting element ED.

The second transistor T2 includes a first electrode connected to the data line DLi, a second electrode connected to the first electrode of the first transistor T1, and a gate electrode connected to the scan line GWLj. The second transistor T2 may be turned on depending on the scan signal GWj transferred through the scan line GWLj and may transfer the data signal Di transferred through the data line DLi to the first electrode of the first transistor T1.

The third transistor T3 includes a first electrode connected to the gate electrode of the first transistor T1, a second electrode connected to the second electrode of the first transistor T1, and a gate electrode connected to the scan line GCLj. The third transistor T3 may be turned on depending on the scan signal GCj transferred through the scan line GCLj, and thus, the gate electrode and the second electrode of the first transistor T1 may be connected, that is, the first transistor T1 may be diode-connected.

The fourth transistor T4 includes a first electrode connected to the gate electrode of the first transistor T1, a second electrode connected to the fourth driving voltage line VL4 through which the second initialization voltage VINT2 is transferred, and a gate electrode connected to the scan line GILj. The fourth transistor T4 may be turned on depending on the scan signal GIj transferred through the scan line GILj such that the second initialization voltage VINT2 is transferred to the gate electrode of the first transistor T1. As such, a voltage of the gate electrode of the first transistor T1 may be initialized. This operation may be referred to as an "an initialization operation".

The fifth transistor T5 includes a first electrode connected to the first driving voltage line VL1, a second electrode connected to the first electrode of the first transistor T1, and a gate electrode connected to the emission control line EMLj.

The sixth transistor T6 includes a first electrode connected to the second electrode of the first transistor T1, a second electrode connected to the anode of the light emitting element ED, and a gate electrode connected to the emission control line EMLj.

The fifth transistor T5 and the sixth transistor T6 may be simultaneously turned on depending on the emission control signal EMj transferred through the emission control line EMLj. The first driving voltage ELVDD may be compensated for through the diode-connected transistor T1 and may be supplied to the light emitting element ED.

The seventh transistor T7 includes a first electrode connected to the second electrode of the sixth transistor T6, a second electrode connected to the third driving voltage line VL3, and a gate electrode connected to the scan line GWLj+1. The seventh transistor T7 is turned on depending on the scan signal GWj+1 transferred through the scan line GWLj+1 and may transfer a current Ibp of the anode of the light emitting element ED to the third driving voltage line VL3.

The first end of the capacitor Cst is connected to the gate electrode of the first transistor T1, and a second end of the capacitor Cst is connected to the first driving voltage line VL1. A cathode of the light emitting element ED may be connected to the second driving voltage line VL2 that transfers the second driving voltage ELVSS. The number of transistors included in one pixel PXij, the number of capacitors included in the pixel PXij, and the connections between the transistors and the capacitors may be modified according to particular embodiments.

The sensor FXij includes the light sensing element OPD and the sensor driving circuit SDC. The light sensing element OPD may be a photodiode. The light sensing element OPD may be an organic photodiode including an organic material as a photoelectric conversion layer. An anode of the light sensing element OPD may be connected to a first sensing node SN1, and a cathode of the light sensing element OPD may be connected to the second driving voltage line VL2 transferring the second driving voltage ELVSS.

The sensor driving circuit SDC includes three transistors ST1 to ST3. The three transistors ST1 to ST3 may include a reset transistor ST1, an amplification transistor ST2, and an output transistor ST3. Some of the reset transistor ST1, the amplification transistor ST2, and the output transistor ST3 may be P-type transistors, and the other(s) may be one or more N-type transistors. The amplification transistor ST2 may be a P-type transistor, and the reset transistor ST1 and the output transistor ST3 may be N-type transistors. All of the reset transistor ST1, the amplification transistor ST2, and the output transistor ST3 may be N-type transistors or P-type transistors.

The transistor type of some (e.g., the reset transistor ST1) of the reset transistor ST1, the amplification transistor ST2, and the output transistor ST3 may be identical to that of the third and fourth transistors T3 and T4 of the pixel PXij. The transistor type of some (e.g., the amplification transistor ST2 and the output transistor ST3) of the reset transistor ST1, the amplification transistor ST2, and the output transistor ST3 may be identical to that of the first and second transistors T1 and T2 of the pixel PXij.

The configuration of the sensor driving circuit SDC may be modified according to particular embodiments.

The reset transistor ST1 includes a first electrode connected to a reset voltage line VL5 that receives the reset voltage VRST, a second electrode connected to the first sensing node SN1, and a gate electrode connected to a reset line RSTL that receives the reset signal RST. The reset transistor ST1 may reset a potential of the first sensing node SN1 to the reset voltage VRST in response to the reset signal RST. The reset signal RST may be a pulse signal transitioning to an active level (e.g., a high level) at the start of one frame. The reset signal RST may be the same as one of the scan signals GIj and GCj. A voltage level of the reset voltage VRST may be lower than a voltage level of the second driving voltage ELVSS.

The amplification transistor ST2 includes a first electrode connected to the first driving voltage line VL1 receiving the first driving voltage ELVDD, a second electrode connected to a second sensing node SN2, and a gate electrode connected to the first sensing node SN1. The amplification transistor ST2 may be turned on depending on a potential of the first sensing node SN1 such that the first driving voltage ELVDD is applied to the second sensing node SN2.

The first electrode of the amplification transistor ST2 may receive the first initialization voltage VINT1 instead of the first driving voltage ELVDD.

The output transistor ST3 includes a first electrode connected to the second sensing node SN2, a second electrode connected to the readout line RLi, and a gate electrode connected to the scan line GWLj receiving the scan signal GWj. The output transistor ST3 may output a sensing signal FSi to the readout line RLi in response to the scan signal GWj.

The circuit configuration of the sensor FXij may be changed according to particular embodiments. The gate electrode of the reset transistor ST1 may be connected to the scan line GCLj, and the gate electrode of the output transistor ST3 may be connected to the scan line GILj.

FIG. 7 is a timing diagram for describing operations of the pixel PXij and the sensor FXij illustrated in FIG. 6 according to an embodiment.

Referring to FIGS. 6 and 7, one frame Fs may include an emission period EP and a non-emission period NEP depending on an operation of the pixel PXij. The emission period EP may correspond to a low-level period (i.e., an active period) of the emission control signal EMj, and the non-emission period NEP may correspond to a high-level period (i.e., an inactive period) of the emission control signal EMj.

The non-emission period NEP may include an initialization period and a data programming and compensation period.

When the scan signal GIj of the high level is provided through the scan line GILj during the initialization period, the fourth transistor T4 is turned on. The first initialization voltage VINT1 is transferred to the gate electrode of the first transistor T1 through the fourth transistor T4 such that the first transistor T1 is initialized.

Subsequently, when the scan signal GCj of the high level is supplied through the scan line GCLj during the data programming and compensation period, the third transistor T3 is turned on. The first transistor T1 is diode-connected by the third transistor T3 thus turned on so as to be forward-biased. When the scan signal GWj of the low level is supplied through the scan line GWLj, the second transistor T2 is turned on. As a result, a compensation voltage, which is obtained by subtracting a threshold voltage of the first transistor T1 from a voltage of the data signal Di supplied from the data line DLi, is applied to the gate electrode of the first transistor T1. A gate voltage applied to the gate electrode of the first transistor T1 may be the compensation voltage.

As the first driving voltage ELVDD and the compensation voltage are respectively applied to the first and second ends of the capacitor Cst, charges corresponding to a difference between the first driving voltage ELVDD and the compensation voltage may be stored in the capacitor Cst.

The seventh transistor T7 is turned on in response to the scan signal GWj+1 of the low level transferred through the scan line GWLj+1. A part of the driving current Id may be drained through the seventh transistor T7 as a bypass current Ibp.

When the light emitting element ED emits a light under the condition that a minimum current of the first transistor T1 flows as a driving current for the purpose of displaying a black image, the black image may not be accurately/satisfactorily displayed. For accurately/satisfactorily displaying a black image, the seventh transistor T7 of the pixel PXij may drain a part of the minimum current of the first transistor T1 to a bypass current path, which is different from a current path to the light emitting element ED, as the bypass current Ibp. The minimum current of the first transistor T1 means a current flowing under the condition that a gate-source voltage of the first transistor T1 is smaller than the threshold voltage, that is, the first transistor T1 is turned off. As a minimum driving current (e.g., a current of 10 pA or less) is transferred to the light emitting element ED, with the first transistor T1 turned off, an image of black luminance is expressed. When the minimum driving current for displaying a black image flows, the influence of a bypass transfer of the bypass current Ibp may be significant; in contrast, when a large driving current for displaying an image such as a non-black image or a white image flows, there may be no significant influence of the bypass current Ibp. When a driving current for displaying a black image flows, a light emitting current Ted of the light emitting element ED, which corresponds to a result of subtracting the bypass current Ibp drained through the seventh transistor T7 from the driving current Id, may have a minimum current amount to such an extent as to accurately/satisfactorily express a black image. A contrast ratio may be improved by accurately implementing an image of black luminance using the seventh transistor T7. The bypass signal may be the scan signal GWj+1 of the low level.

Subsequently, at the start of the emission period EP, the emission control signal EMj supplied from the emission control line EMLj transitions from the high level to the low level. During the emission period EP, the fifth transistor T5 and the sixth transistor T6 are turned on by the emission control signal EMj of the low level. The driving current Id is generated depending on a difference between the gate voltage of the gate electrode of the first transistor T1 and the first driving voltage ELVDD and is supplied to the light emitting element ED through the sixth transistor T6. As a result, the current Ted flows through the light emitting element ED.

When the reset signal RST transitions to the high level at the start of one frame Fs, the reset transistor ST1 may be turned on such that the first sensing node SN1 is initialized to the reset voltage VRST.

A light exposure period of the sensor FXij may correspond to the emission period EP of the pixel PXij. During the emission period EP, the emission control signal EMj is maintained at the low level. The light sensing element OPD is exposed to the light during the emission period EP. The light may be the light output from the light emitting element ED of the pixel PXij.

When the user's hand touches the display surface FS, the light sensing element OPD may generate photoelectrons corresponding to the light reflected by a ridge of a fingerprint and/or a valley between ridges, and the generated photoelectrons may be accumulated at the first sensing node SN1.

The amplification transistor ST2 may function as a source follower amplifier that generates a source-drain current in proportion to the amount of charges of the first sensing node SN1, which are input to the gate electrode of the amplification transistor ST2.

When the scan signal GWj is at an inactive level, that is, a high level, an off state of the output transistor ST3 is maintained. When the scan signal GWj transitions to an active level, that is, a low level, the output transistor ST3 is turned on. When the output transistor ST3 is turned on, the detection signal FSi corresponding to a current flowing through the amplification transistor ST2 may be output to the readout line RLi.

The display panel DP may include the pixel PXij and the sensor FXij, and the sensor FXij may be driven by the scan signal GWj for driving the pixel PXij. Instances/copies of the scan signal GWj may be respectively supplied to the pixel PXij and the output transistor ST3 of the sensor FXij. Therefore, a separate signal line or a separate circuit is unnecessary to drive the sensor FXij. Advantageously, even though the sensor FXij is disposed on the display panel DP, the reduction in an aperture ratio may be minimized or prevented.

When an external light is scattered through the collision with fine dust, the light sensing element OPD may receive the scattered light, and photoelectrons corresponding to the received light may be accumulated at the first sensing node SN1. A current corresponding to the photoelectrons accumulated at the first sensing node SN1 may be output to the readout line RLi through the amplification transistor ST2 and the output transistor ST3.

Figure 8A:
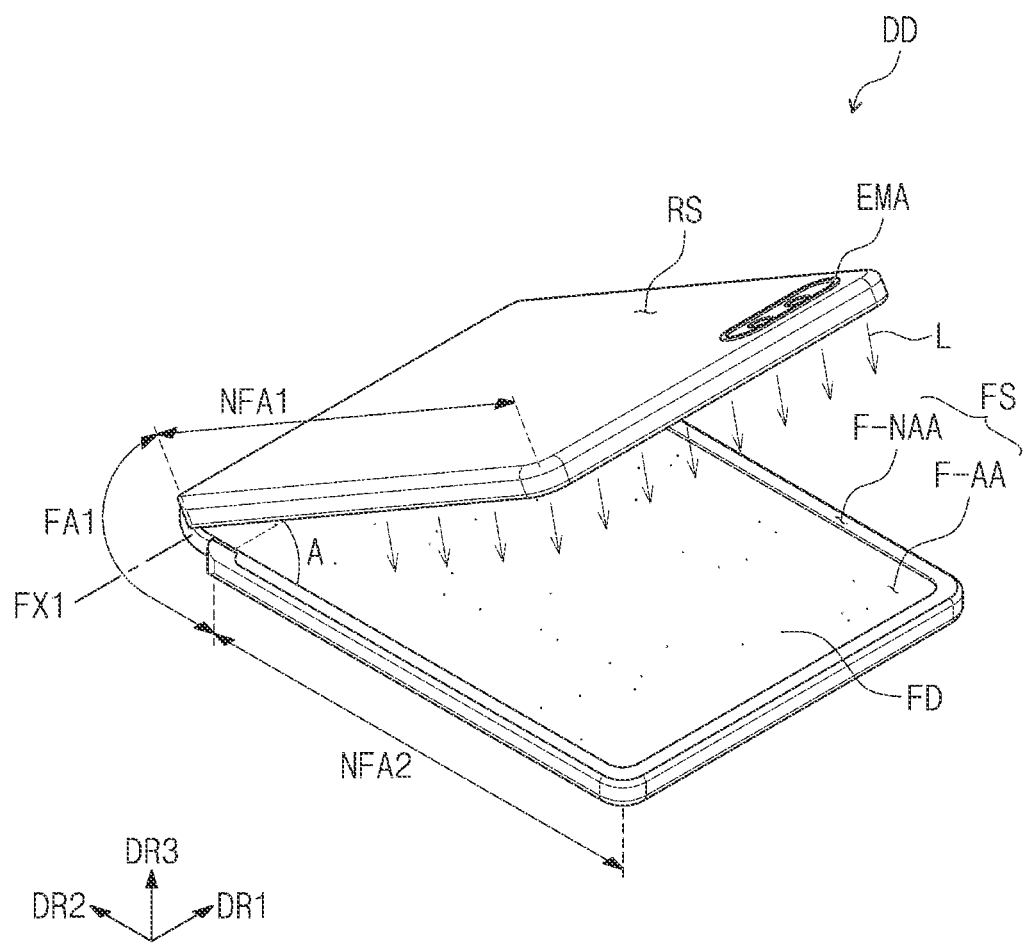
FIG. 8A and FIG. 8B are diagrams for describing operations of a display device during a fine dust sensing mode according to one or more embodiments.
Figure 8B:
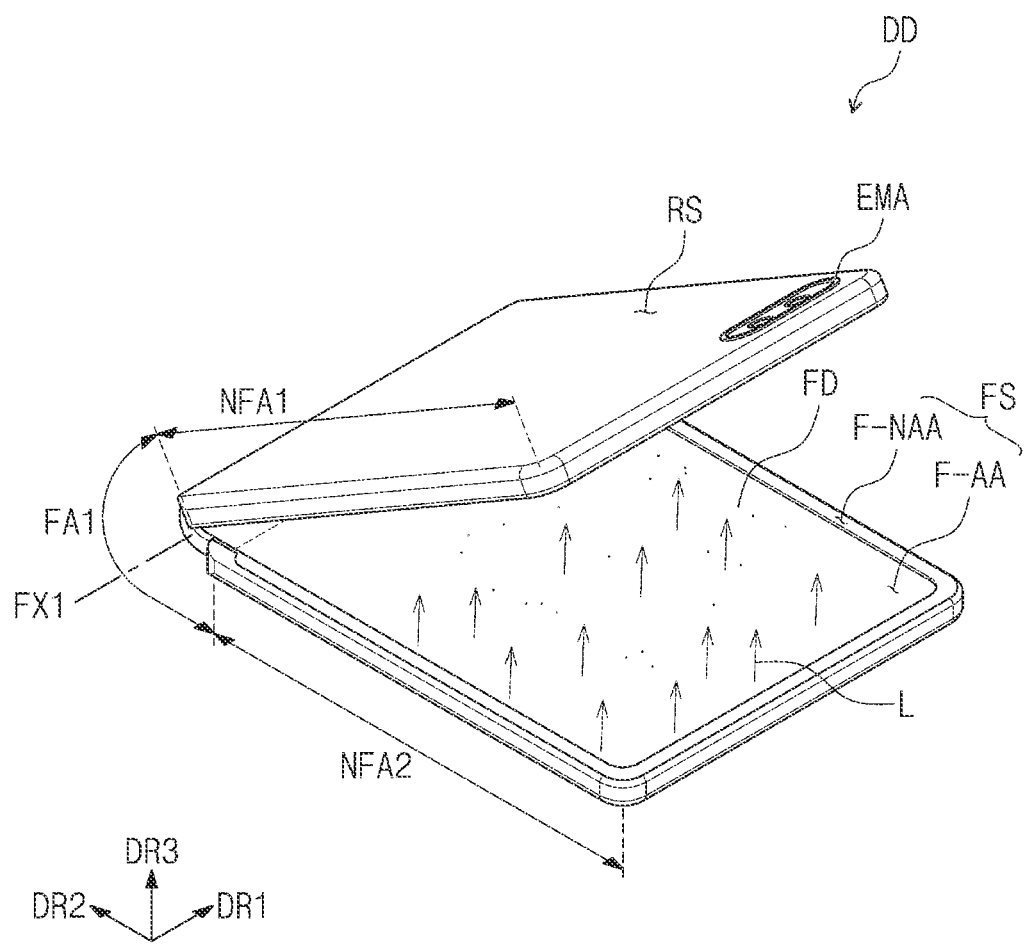

FIGS. 8A and 8B are diagrams for describing operations of a display device DD during a fine dust sensing mode according to one or more embodiments.

Referring to FIGS. 4 and 8A, during the fine dust sensing mode, the display device DD may be partially folded inward.

During the fine dust sensing mode, the driving controller 100 may allow the pixels PX in the first non-folding area NFA1 (or first part NFA1) of the display panel DP to operate in a light emitting mode and may allow the sensors FX in the second non-folding area NFA2 (or second part NFA2) of the display panel DP to operate in a light receiving mode.

A light "L" output from the pixels PX in the first non-folding area NFA1 may be transferred to the sensors FX in the second non-folding area NFA2 through fine dust FD in the air.

The light "L" is scattered by the collision with the fine dust FD. As the number of particles of the fine dust FD between the first non-folding area NFA1 and the second non-folding area NFA2 of the display device DD increases, the degree of scattering of the light "L" may increase. The degree of scattering of the light "L" may be proportional to a mass concentration of the fine dust FD.

During the fine dust sensing mode, the readout circuit 500 may calculate a fine dust concentration based on readout signals FSi (wherein i=1 to m) received through the readout lines RL1 to RLm and may provide the readout signal FSS corresponding to the calculated fine dust concentration to the driving controller 100.

The readout circuit 500 may provide the driving controller 100 with the readout signals FSi (wherein i=1 to m) received through the readout lines RL1 to RLm. During the fine dust sensing mode, the driving controller 100 may calculate a fine dust concentration based on the readout signals FSi (wherein i=1 to m) received from the readout circuit 500. The driving controller 100 may display information about the calculated fine dust concentration on the display panel DP.

Although not illustrated in drawing, the display device DD may include a processor (e.g., an application processor, a host processor, or a central processing unit (CPU)) for calculating the fine dust concentration. The driving controller 100 may provide the processor with the readout signal FSS received from the readout circuit 500. The processor may calculate a fine dust concentration based on the readout signal FSS provided from the readout circuit 500 through the driving controller 100.

An angle "A" between the first non-folding area NFA1 and the second non-folding area NFA2 of the display surface FS may be limited to a reference range in which the light "L" output from the pixels PX in the first non-folding area NFA1 is sufficiently transferred to the sensors FX in the second non-folding area NFA2. The angle "A" between the first non-folding area NFA1 and the second non-folding area NFA2 of the display surface FS may be 45 degrees or less.

The display device DD may operate in the fine dust sensing mode when the angle "A" between the first non-folding area NFA1 and the second non-folding area NFA2 of the display surface FS is within the given reference range.

During the fine dust sensing mode, the pixels PX in the first non-folding area NFA1 of the display panel DP may output a light of a predetermined color and/or luminance.

During the fine dust sensing mode, the pixels PX in the second non-folding area NFA2 of the display panel DP may be in a disabled (or non-operation) state. During the fine dust sensing mode, the sensors FX in the first non-folding area NFA1 of the display panel DP may be in a disabled (or non-operation) state. When the sensors FX in the first non-folding area NFA1 of the display panel DP operate during the fine dust sensing mode, the readout circuit 500 may not receive a sensing signal from the sensors FX in the first non-folding area NFA1.

Referring to FIGS. 4 and 8B, during the fine dust sensing mode, the display device DD may be partially folded inward.

During the fine dust sensing mode, the driving controller 100 may allow the pixels PX in the second non-folding area NFA2 (or second part NFA2) of the display panel DP to operate in a light emitting mode and may allow the sensors FX in the first non-folding area NFA1 (or first part NFA1) of the display panel DP to operate in a light receiving mode.

FIGS. 8A and 8B show the operations of the display device DD during the fine dust sensing mode. Analogous to the above-described operation of the display device DD, each of the display device DD-a illustrated in FIGS. 2A to 2C and the display device DD-b illustrated in FIGS. 3A and 3B may operate in the fine dust sensing mode.

An embodiment in which the pixels PX in one of the first non-folding area NFA1 and the second non-folding area NFA2 emit a light and the sensors FX in the other of the first non-folding area NFA1 and the second non-folding area NFA2 receive the light is illustrated in each of FIGS. 8A and 8B.

The pixels PX in both the first non-folding area NFA1 and the second non-folding area NFA2 may emit a light, and the sensors FX in both the first non-folding area NFA1 and the second non-folding area NFA2 receive the light emitted from the opposite non-folding area.

Some of the pixels PX in one of the first non-folding area NFA1 and the second non-folding area NFA2 may emit a light, and some of the sensors FX in the other of the first non-folding area NFA1 and the second non-folding area NFA2 may receive the light.

Figure 9:
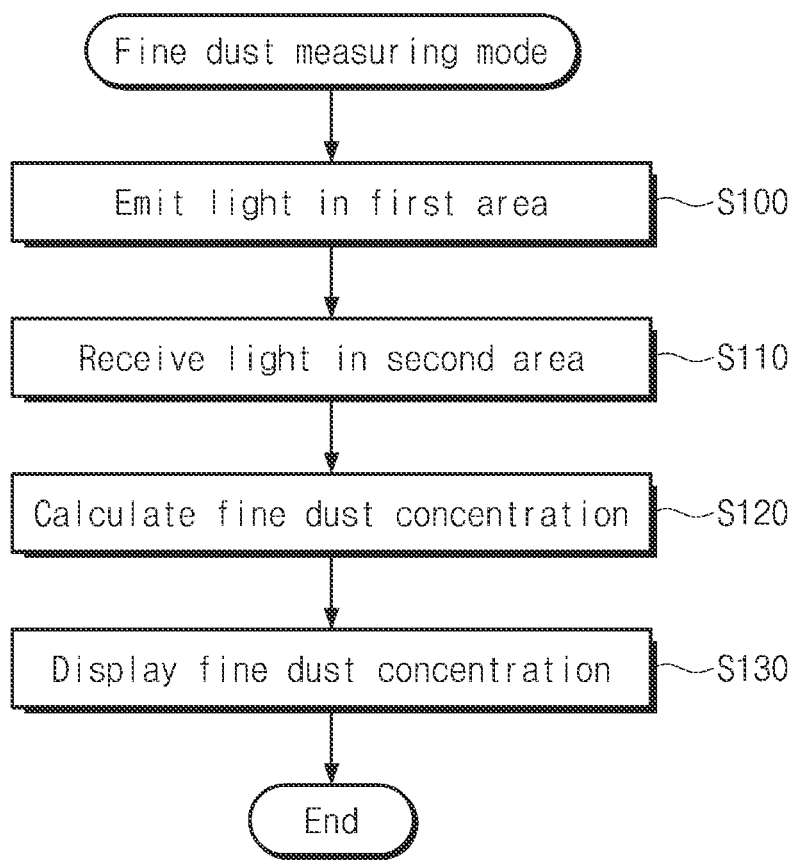
FIG. 9 is a flowchart illustrating an operation of a display device according to an embodiment.

FIG. 9 is a flowchart illustrating an operation of a display device according to an embodiment.

Referring to FIGS. 4 and 9, the driving controller 100 allows the pixels PX in a first area of the display panel DP to emit a light during the fine dust sensing mode (operation/step S100). As illustrated in FIG. 8A, the first area of the display panel DP may be in the first non-folding area NFA1 of the display panel DP. The first area of the display panel DP may be the whole active area of the first non-folding area NFA1 of the display panel DP or may be a part of the active area of the first non-folding area NFA1 of the display panel DP. As illustrated in FIG. 8B, the first area of the display panel DP may be in the second non-folding area NFA2 of the display panel DP.

The driving controller 100 allows the sensors FX in a second area of the display panel DP to receive the light (operation/step S110). As illustrated in FIG. 8B, the second area of the display panel DP may be in the second non-folding area NFA2 of the display panel DP. The second area of the display panel DP may be the whole active area of the second non-folding area NFA2 of the display panel DP or may be a part of the active area of the second non-folding area NFA2 of the display panel DP. The second area of the display panel DP may be the first non-folding area NFA1 of the display panel DP.

During the fine dust sensing mode, the readout circuit 500 calculates a fine dust concentration based on the readout signals FSi (wherein i=1 to m) received from the sensors FX in the second area of the display panel DP (operation/step S120). The readout circuit 500 may provide the readout signal FSS corresponding to the calculated fine dust concentration to the driving controller 100.

The readout circuit 500 may provide the driving controller 100 with the readout signals FSi (wherein i=1 to m) received through the readout lines RL1 to RLm. The driving controller 100 may calculate the fine dust concentration based on the readout signal FSS provided from the readout circuit 500.

The driving controller 100 may display information about the calculated fine dust concentration on the display panel DP (operation/step S130).

Figure 10:
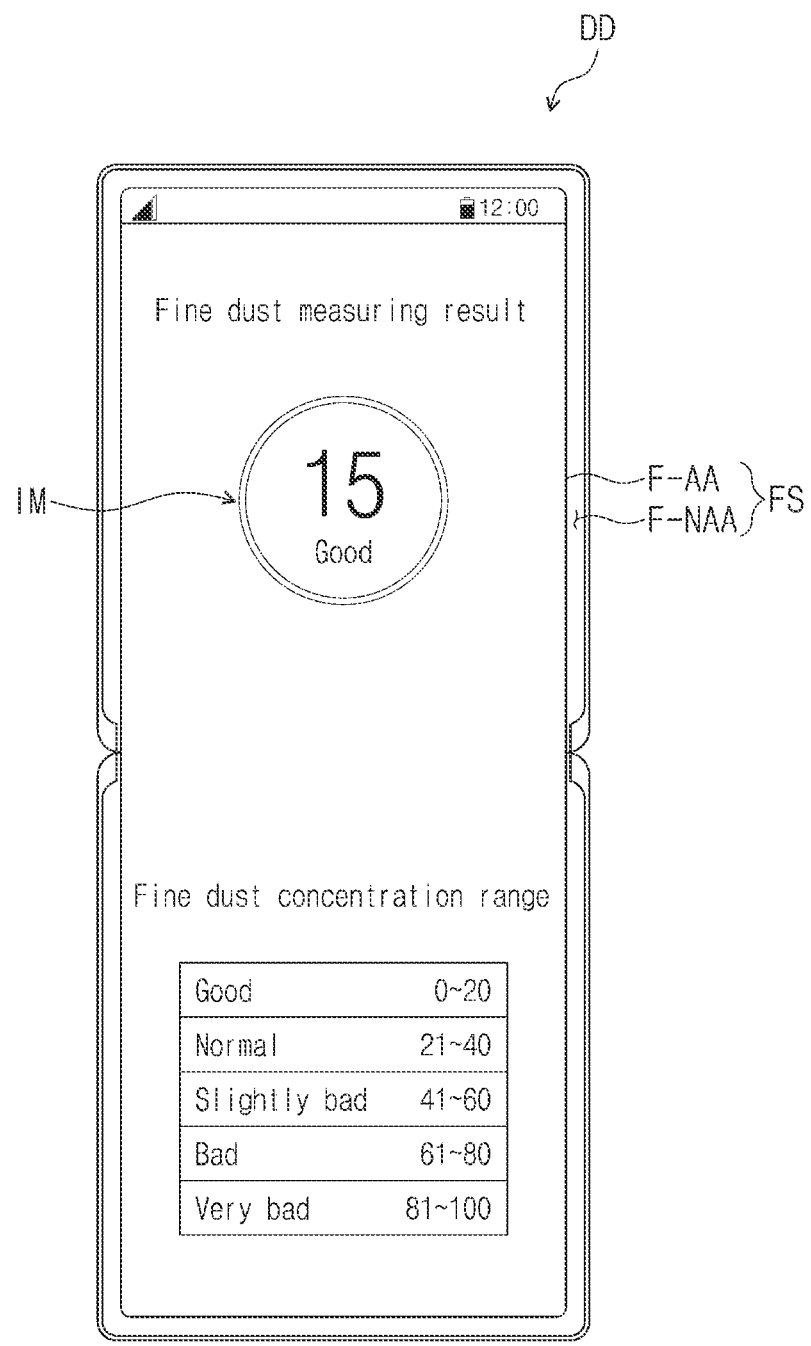
FIG. 10 illustrates a fine dust measuring result displayed on a display device according to an embodiment.

FIG. 10 illustrates a fine dust measuring result displayed on the display device DD according to an embodiment.

Referring to FIGS. 4 and 10, under control of the driving controller 100, an image IM corresponding to a fine dust measuring result may be displayed on the display surface FS.

The image IM corresponding to the fine dust measuring result may be different from what is illustrated in FIG. 10 and may be changed according to particular embodiments. The user may intuitively and easily perceive the fine dust concentration information through the image IM displayed on the display surface FS of the display device DD.

According to embodiments, a display device includes an optics-based fingerprint sensor for sensing a fingerprint. The display device may sense fine dust using the optics-based fingerprint sensor. According to the fine dust information provided by the display device, the user may determine whether to take actions (e.g., wearing a mask or moving away from the dusty area) to protect health.

While examples of embodiments have been described, various changes and modifications may be made to the described embodiments without departing from the scope set forth in the following claims.

What is claimed is:

1. A display device comprising:
   a display panel comprising a first part and a second part, wherein the first part comprises a first pixel set, and wherein the second part comprises a first sensor set;
   a driving controller configured to control the first pixel set to emit first light when controlling the first sensor set to receive second light, wherein the first sensor set is configured to generate a sensing signal using the second light; and
   a readout circuit including at least a readout line to transmit the sensing signal and electrically connected to at least one of the driving controller and the first sensor set and configured to receives the sensing signal,
   wherein the readout circuit is configured to calculate a dust concentration using the sensing signal and send the dust concentration to the driving controller.

2. The display device of claim 1, wherein the first sensor set includes a first sensor, and wherein the first sensor includes:
   a light sensing element configured to receive the second light; and
   a sensor driving circuit electrically connected to the light sensing element and configured to output the sensing signal.

3. The display device of claim 2, wherein the sensor driving circuit includes:
   a first sensing node;
   a second sensing node;
   a reset transistor including a first electrode for receiving a reset voltage, a second electrode electrically connected to the first sensing node, and a gate electrode for receiving a reset signal;
   an amplification transistor including a first electrode for receiving a driving voltage, a second electrode electrically connected to a second sensing node, and a gate electrode electrically connected to the first sensing node; and
   an output transistor including a first electrode electrically connected to the second sensing node, a second electrode electrically connected to the readout line, and a gate electrode for receiving a scan signal.

4. The display device of claim 3, wherein the readout circuit is electrically connected to the readout line for receiving the sensing signal from the readout line.

5. The display device of claim 3, wherein the reset transistor is an N-type transistor, and wherein the amplification transistor and the output transistor are P-type transistors.

6. The display device of claim 3, wherein the first pixel set includes a first pixel, and wherein the first pixel includes:
   a light emitting element; and
   a pixel driving circuit configured to drive the light emitting element in response to at least one scan signal.

7. The display device of claim 6, wherein the pixel driving circuit includes:
   a first transistor including a first electrode electrically connected to a first driving voltage line for receiving a first driving voltage, a second electrode electrically connected to the light emitting element, and a gate electrode;
   a second transistor electrically connected between a data line and the first electrode of the first transistor and including a gate electrode for receiving a first scan signal; and
   a third transistor electrically connected between the second electrode of the first transistor and the gate electrode of the first transistor and including a gate electrode for receiving a second scan signal.

8. The display device of claim 7, wherein the first transistor and the second transistor are P-type transistors, and wherein the third transistor is an N-type transistor.

9. The display device of claim 7, wherein the scan signal provided to the gate electrode of the output transistor in the sensor driving circuit is identical to the first scan signal provided to the gate electrode of the second transistor in the pixel driving circuit.

10. The display device of claim 7, wherein the light emitting element is an organic light emitting diode, and wherein the light sensing element is an organic photodiode.

11. The display device of claim 1, wherein the first part comprises a first image display surface, wherein the second part comprises a second image display surface, and wherein the driving controller is configured to control the first pixel set to emit the first light and the first sensor set to receive the second light when the first image display surface and the second image display surface face each other.

12. The display device of claim 11, wherein the driving controller is configured to start controlling the first pixel set to emit the first light and the first sensor set to receive the second light when an angle between the first part and the second part is within a predetermined range.

13. The display device of claim 1, wherein the display panel further comprises a third part, wherein the third part is more flexible than each of the first part and the second part, wherein the first part is connected through the third part to the second part, and wherein the driving controller is configured to start controlling the first pixel set to emit first light and the first sensor set to receive second light when the third part is bent to a degree that is within a predetermined range.

14. The display device of claim 1, wherein the first part comprises a second sensor set, wherein the second part comprises a second pixel set, and wherein the driving controller is configured to control the second pixel set to emit third light when controlling the second sensor set to receive fourth light.

15. The display device of claim 1, wherein at least one of the readout circuit and the driving controller is configured to calculate the dust concentration.

16. The display device of claim 1, wherein the driving controller is configured to control at least one of the first part and the second part to display an image that includes information related to the dust concentration.

17. The display device of claim 1, wherein the driving controller is configured to control at least the first pixel set to display an image that includes information related to the dust concentration.

18. A method of operating a display device, the display device comprising a display panel, the method comprising:

emitting first light using a first pixel set disposed in a first part of the display panel;

receiving second light using a first sensor set disposed in a second part of the display panel when the first pixel set emits the first light;

generating a sensing signal using the first sensor set and the second light;

calculating a dust concentration by at least one of a processor, a driving controller, and a readout circuit of the display device based on the sensing signal; and displaying an image that includes information related to the dust concentration on the display panel, wherein the readout circuit including at least a readout line to transmit the sensing signal is electrically connected to at least one of the driving controller and the first sensor set and receives the sensing signal.

19. The method of claim 18, wherein the emitting and the receiving are started when an angle between the first part and the second part is within a predetermined range.

20. The method of claim 18, wherein the image is displayed on at least one of the first part of the display panel, the second part of the display panel, and a third part of the display panel, wherein the third part of the display panel is more flexible than each of the first part of the display panel and the second part of the display panel, and wherein the first part of the display panel is connected through the third part of the display panel to the second part of the display panel.

* * * * *